(12) United States Patent
Seong et al.

(10) Patent No.: US 10,403,791 B2
(45) Date of Patent: Sep. 3, 2019

(54) VERTICAL LIGHT-EMITTING DIODE DEVICE AND METHOD OF FABRICATING THE SAME

(71) Applicants: Tae Yeon Seong, Seoul (KR); Ki Seok Kim, Hwaseong-si (KR); Sung-joo Song, Seoul (KR)

(72) Inventors: Tae Yeon Seong, Seoul (KR); Ki Seok Kim, Hwaseong-si (KR); Sung-joo Song, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/629,051

(22) Filed: Jun. 21, 2017

(65) Prior Publication Data

US 2018/0006191 A1    Jan. 4, 2018

(30) Foreign Application Priority Data

Jul. 1, 2016    (KR) .................... 10-2016-0083693

(51) Int. Cl.
| | | |
|---|---|---|
| *H01L 21/02* | (2006.01) | |
| *H01L 29/20* | (2006.01) | |
| *H01L 29/02* | (2006.01) | |
| *H01L 33/24* | (2010.01) | |
| *H01L 33/00* | (2010.01) | |
| *H01L 33/32* | (2010.01) | |

(Continued)

(52) U.S. Cl.
CPC .......... *H01L 33/24* (2013.01); *H01L 33/0075* (2013.01); *H01L 33/20* (2013.01); *H01L 33/32* (2013.01); *H01L 33/30* (2013.01); *H01L 33/38* (2013.01); *H01L 33/40* (2013.01); *H01L 33/42* (2013.01)

(58) Field of Classification Search
CPC ..... H01L 33/24; H01L 33/32; H01L 33/0075; H01L 33/0025; H01L 33/14; H01L 33/28; H01L 33/44; H01L 33/007; H01L 21/288; H01L 33/40
See application file for complete search history.

(56) References Cited

U.S. PATENT DOCUMENTS

| | | | | |
|---|---|---|---|---|
| 6,979,489 B2* | 12/2005 | Lu | ......................... | B82Y 15/00 |
| | | | | 428/209 |
| 8,536,618 B2* | 9/2013 | Richardson | ............. | H01L 33/14 |
| | | | | 257/183 |

(Continued)

FOREIGN PATENT DOCUMENTS

| | | |
|---|---|---|
| KR | 1020120060992 A | 6/2012 |
| KR | 1020130027303 A | 3/2013 |

*Primary Examiner* — Mary A Wilczewski
*Assistant Examiner* — Tsz K Chiu
(74) *Attorney, Agent, or Firm* — Andrew D. Fortney; Central California IP Group, P.C.

(57) ABSTRACT

A vertical light-emitting diode device and a method of fabricating the same are provided. The device may include a conductive substrate serving as a p electrode, a p-type GaN layer provided on the conductive substrate, an active layer provided on the p-type GaN layer, an n-type GaN layer provided on the active layer, an n electrode pattern provided on the n-type GaN layer, a metal oxide structure filling a plurality of holes formed in the n-type GaN layer, and a seed layer provided on bottom surfaces of the holes and used to as a seed in a crystal growth process of the metal oxide structure.

20 Claims, 14 Drawing Sheets

(51) Int. Cl.
*H01L 33/20* (2010.01)
*H01L 33/30* (2010.01)
*H01L 33/40* (2010.01)
*H01L 33/42* (2010.01)
*H01L 33/38* (2010.01)

(56) References Cited

U.S. PATENT DOCUMENTS 9,172,014 B2 * 10/2015 Behringer ............... H01L 33/58
2014/0069496 A1 * 3/2014 Biswas .................. B82Y 20/00
　　　　　　　　　　　　　　　　　　　136/256

* cited by examiner

VERTICAL LIGHT-EMITTING DIODE DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2016-0083693, filed on Jul. 1, 2016, in the Korean Intellectual Property Office, the entire contents of which are hereby incorporated by reference.

BACKGROUND OF THE INVENTION

The present disclosure relates to a vertical light-emitting diode device and a method of fabricating the same. The formation of the vertical light-emitting diode device may include forming holes in an n-type GaN layer, forming a sidewall, which is made of a metal, metal alloy, or dielectric material, on an inner side surface of each of the holes, and growing a metal oxide structure from a bottom surface of each of the holes.

Thus, when light is totally reflected inward from an interface between the n-type GaN layer and the air, the light may be emitted through the metal oxide structure. This may make it possible to realize a vertical light-emitting diode device with high light extraction efficiency.

A light-emitting diode (LED) has several advantages, such as long lifetime, low power consumption, excellent initial drive property, high vibration resistance, and high tolerance for repetitive power interruptions, compared with a light-emitting diode device using a filament, and thus, the demand for the LED device is steadily increasing. Recently, there is an increasing interest in using a group III nitride semiconductor compound, which can emit a short wavelength of light (e.g., blue light), to a LED device.

For a nitride light-emitting diode, light generated in an active layer is emitted through a nitride semiconductor layer. However, due to a large difference in refractive index between the nitride semiconductor layer and the air, a critical angle is very small, and thus, a large fraction of light is totally reflected. Accordingly, an amount of light to be emitted to the outside from the nitride semiconductor layer is reduced.

SUMMARY

Some embodiments of the inventive concept provide a vertical light-emitting diode device, which is configured to suppress total reflection, which occur at an interface between a nitride semiconductor layer and the air, and thereby to increase an amount of light to be emitted to the outside from an active layer.

According to some embodiments of the inventive concept, a vertical light-emitting diode device may include a conductive substrate serving as a p electrode, a p-type GaN layer provided on the conductive substrate, an active layer provided on the p-type GaN layer, an n-type GaN layer provided on the active layer, an n electrode pattern provided on the n-type GaN layer, a metal oxide structure filling a plurality of holes formed in the n-type GaN layer, and a seed layer provided on bottom surfaces of the holes and used to as a seed in a crystal growth process of the metal oxide structure.

In some embodiments, the device may further include a sidewall provided on an inner side surface of each of the holes.

In some embodiments, the sidewall may be formed of a metal or a metal alloy, and a refractive index of the metal oxide structure may be less than that of the n-type GaN layer.

In some embodiments, the sidewall may be formed of a dielectric material, a refractive index of the metal oxide structure may be less than that of the n-type GaN layer, and a refractive index of the sidewall may be less than that of the metal oxide structure.

In some embodiments, the metal oxide structure may be formed of a metal oxide material that is selected from zinc oxide (ZnO), zirconium oxide ($ZrO_2$), titanium oxide ($TiO_2$), chromium oxide ($Cr_2O$), indium zinc oxide (IZO), indium tin zinc oxide (IZTO), indium oxide ($In_2O_3$), or tin oxide ($SnO_2$).

In some embodiments, the holes may be formed to meet a condition of D>W/4, where D and W are a depth and a diameter of each hole.

In some embodiments, the diameter W of the hole meets a condition of W/λ>2.405, where λ is a wavelength of light emitted from the active layer.

In some embodiments, the depth of the hole ranges from 200 nm to 3 μm.

In some embodiments, the diameter of the hole ranges from 300 nm to 4 μm.

According to some embodiments of the inventive concept, a method of fabricating a vertical light-emitting diode device may include sequentially growing a buffer layer, an n-type GaN layer, an active layer, and a p-type GaN layer on a single-crystalline growth substrate, sequentially forming a metal reflection layer and a conductive substrate on the p-type GaN layer, performing a laser lift-off process to separate the single-crystalline growth substrate and remove the buffer layer, patterning the n-type GaN layer to form holes, forming a sidewall on an inner side surface of each of the holes, forming a seed layer on bottom surfaces of the holes, crystal-growing a metal oxide structure on the seed layer, and forming an n electrode pattern on the n-type GaN layer.

In some embodiments, the metal oxide structure may be formed of a metal oxide material that is selected from zinc oxide (ZnO), zirconium oxide ($ZrO_2$), titanium oxide ($TiO_2$), chromium oxide ($Cr_2O$), indium zinc oxide (IZO), indium tin zinc oxide (IZTO), indium oxide ($In_2O_3$), or tin oxide ($SnO_2$).

In some embodiments, the metal oxide structure may be grown by a hydrothermal deposition process.

In some embodiments, the sidewall may be formed of a metal or a metal alloy, and a refractive index of the metal oxide structure may be less than that of the n-type GaN layer.

In some embodiments, the sidewall may be formed of a dielectric material, a refractive index of the metal oxide structure may be less than that of the n-type GaN layer, and a refractive index of the sidewall may be less than that of the metal oxide structure.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
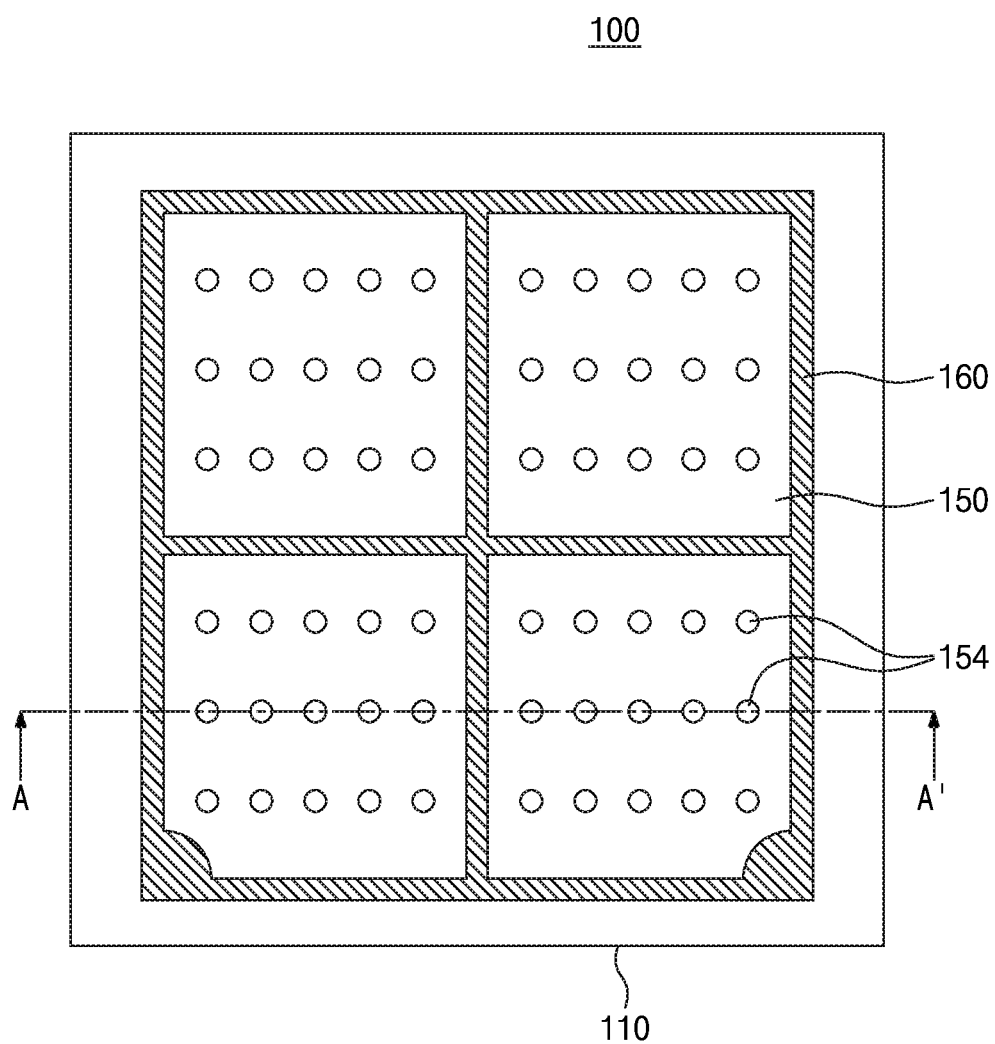
FIG. 1A is a plan view of a vertical light-emitting diode device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

When light propagates from a dense medium to a sparse medium, the light may be totally reflected by an interface between the two media, and this phenomenon is called 'total reflection'. The total reflection may occur in a light-emitting diode in which a group III nitride-based material is used. Gallium nitride (GaN) having a refractive index of about 2.4 is a group III nitride-based material which is being generally used for an n-type semiconductor layer, a p-type semiconductor layer, and an active layer. Since there is no substantial difference in refractive index, light generated in the active layer is allowed to propagate toward the n- or p-type semiconductor layer without any difficulty. However, since a difference in refractive index between gallium nitride (GaN) and the air is considerably large, most of the light may be totally reflected by an interface between the n- or p-type semiconductor layer and the air. According to some embodiments of the inventive concept, light totally reflected by the interface between the n-type GaN layer and the air may be emitted to the outside through a metal oxide structure, and thus, it may be possible to increase light extraction efficiency.

In addition, to increase a viewing angle of a conventional vertical light-emitting diode device, it is necessary to insert particles causing light scattering in an encapsulation layer or to change a shape of a lens or a package. In some embodiments, a shape of an end portion of the metal oxide structure may be changed to control a viewing angle of a vertical light-emitting diode device.

Furthermore, a sidewall, which is formed of a highly conductive metal, a metal alloy, or a dielectric material, may be provided. The sidewall may be used to change a distribution of an electric field and thus it may be used to uniformly supply electric current to the n-type GaN layer.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A is a plan view of a vertical light-emitting diode device according to some embodiments of the inventive concept.

Figure 1B:
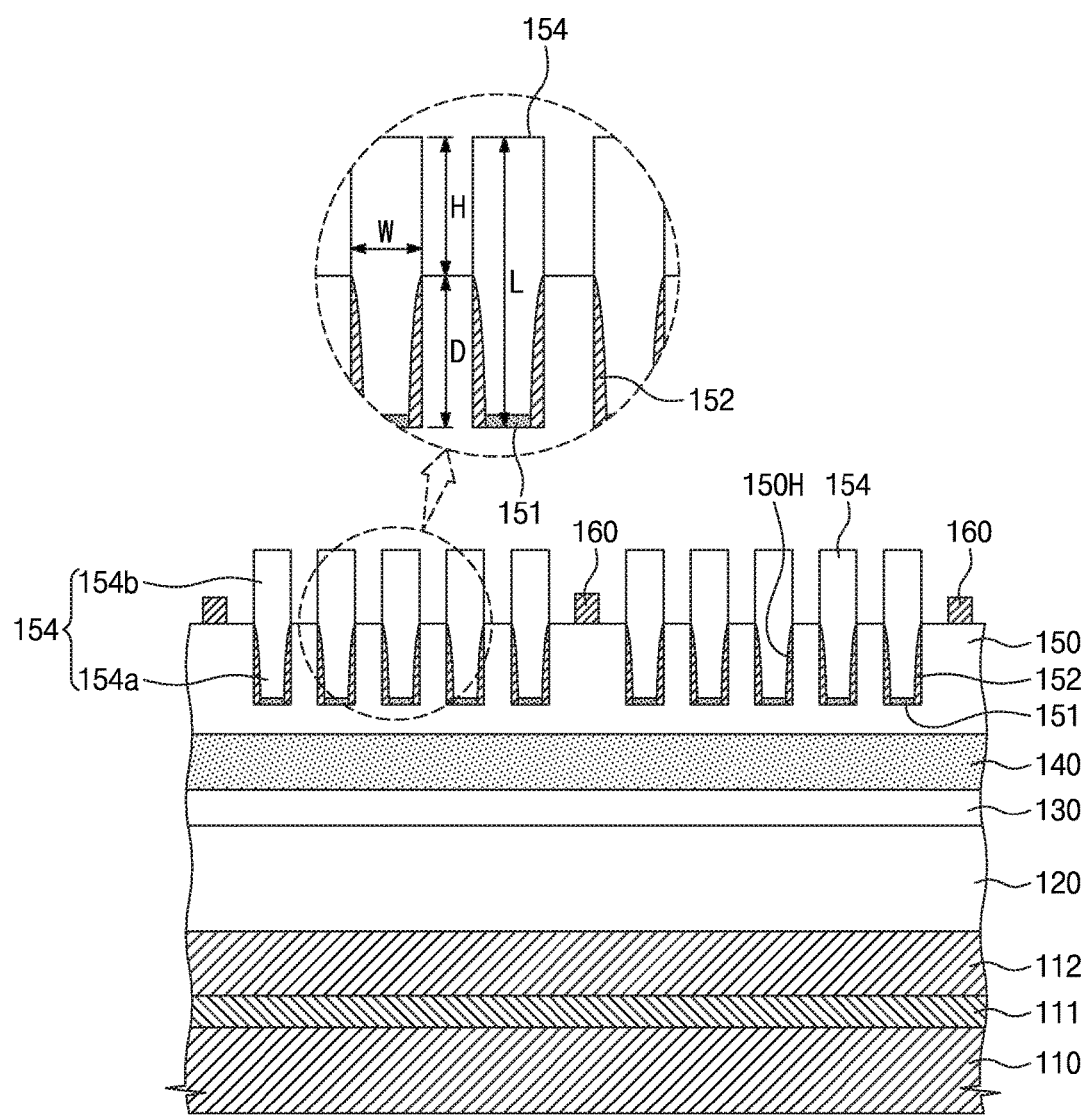
FIG. 1B is a sectional view taken along line A-A' of FIG. 1A.

FIG. 1B is a sectional view taken along line A-A' of FIG. 1A.

Figure 1C:
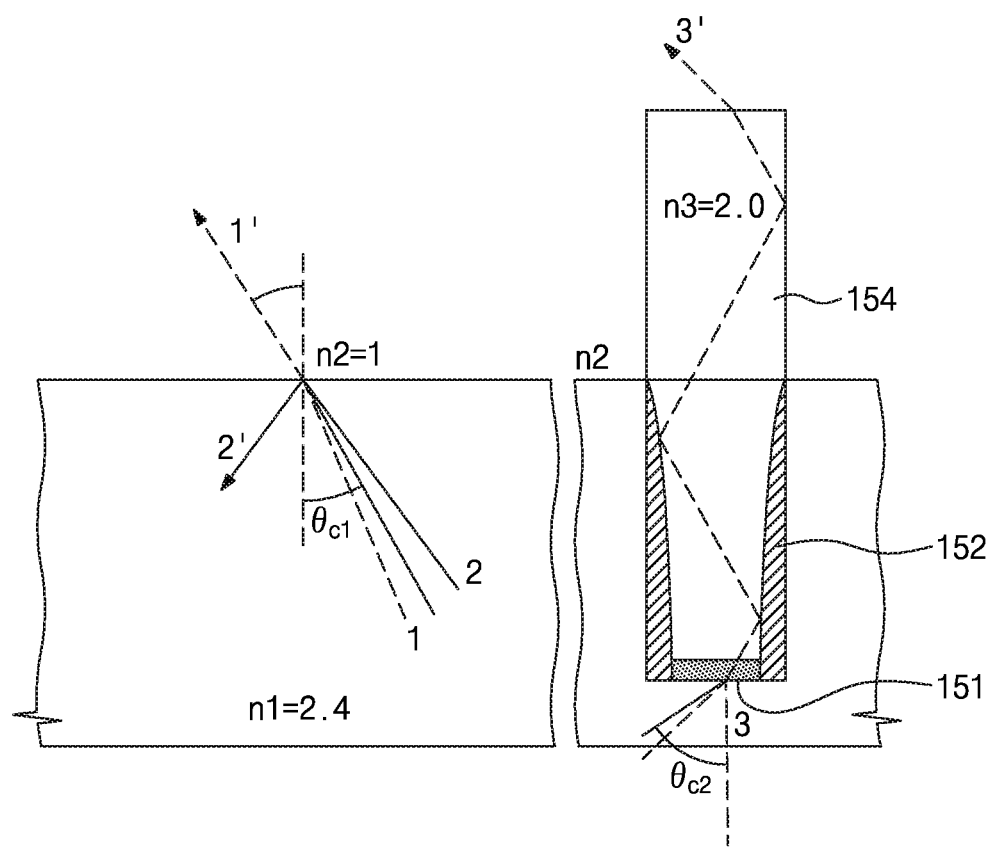
FIG. 1C is a diagram illustrating a change in light propagation path caused by a sidewall, according to some embodiments of the inventive concept.

FIG. 1C is a diagram illustrating a change in light propagation path, which is caused by a sidewall, in the structure of FIG. 1B.

Referring to FIGS. 1A, 1B, and 1C, a vertical light-emitting diode device 100 may include a conductive substrate 110 serving as a p electrode, a p-type GaN layer 120 on the conductive substrate 110, an active layer 140 on the p-type GaN layer 120, an n-type GaN layer 150 on the active layer 140, an n electrode pattern 160 on the n-type GaN layer 150, a metal oxide structure 154 filling a plurality of holes 150H formed in the n-type GaN layer 150, and a seed layer 151 which is provided on bottom surfaces of the holes 150H and is used as a seed layer in a crystal growth process of the metal oxide structure 154.

The conductive substrate 110 may be used to support a semiconductor structure including the p-type GaN layer 120, the active layer 140, and the n-type GaN layer 150 and to serve as the p electrode.

A wafer bonding layer 111 may be provided on the conductive substrate 110. The wafer bonding layer 111 may be formed of or include at least one of various Sn-containing alloys (e.g., Au/Sn alloys or Ni/Sn alloys). The wafer bonding layer 111 may be formed by a low-temperature thermal treatment process (e.g., of 200° C.) and may be used to bond the conductive substrate 110 to a metal reflection layer 112.

The metal reflection layer 112 may be provided on the wafer bonding layer 111. The metal reflection layer 112 may be used to reflect light, which is emitted from the active layer 140, toward the n-type GaN layer 150. When light extraction efficiency is considered, the metal reflection layer 112 may be formed of Ag, Al, or any combination thereof.

The p-type GaN layer 120 may be provided on the metal reflection layer 112. The p-type GaN layer 120 may be a semiconductor layer that is doped with p-type impurities.

An electron blocking layer (EBL) 130 may be provided between the p-type GaN layer 120 and the active layer 140. The electron blocking layer 130 may prevent an electron overflow issue from occurring in the active layer. The electron blocking layer 130 may contribute to enhance electron-hole recombination. The electron blocking layer 130 may be formed of an AlGaN material doped with p-type impurities.

The active layer 140 may be provided on the electron blocking layer 130. In the active layer 140, electrons injected through the n-type GaN layer 150 may be coupled to holes injected through the p-type GaN layer 120. A wavelength of light emitted from the active layer 140 may be determined depending on a material used for the active layer 140 or on a value of band gap of the material. The active layer 140 may have a double heterostructure, a single quantum well, or a multiple quantum well. In the case where the vertical light-emitting diode device 100 is a blue or green LED, the multiple quantum well may be an InGaN/GaN structure. In the case where the vertical light-emitting diode device 100 is an ultraviolet LED, the multiple quantum well may be an AlGaN/InGaN structure.

The n-type GaN layer 150 may be provided on the active layer 140. The n-type GaN layer 150 may be a compound semiconductor layer that is doped with n-type impurities. The n-type GaN layer 150 may include a plurality of holes 150H that are formed by a reactive ion etching (RIE) process. A depth D and a diameter W of each of the holes 150H may be determined, when a patterning process on the n-type GaN layer 150 is performed. The holes 150H may be formed to satisfy the following formulae 1 and 2.

$$D > W/4 \quad \text{[Formula 1]}$$

$$W/\lambda > 2.405 \quad \text{[Formula 2]}$$

where λ is a wavelength of light emitted from the active layer 140.

The formula 1 describes the condition for stably growing the metal oxide structure 154 in a direction perpendicular to the n-type GaN layer 150. The formula 2 describes the condition for allowing light to be stably guided through the metal oxide structure 154. Under consideration on the formulae 1 and 2, the holes 150H may be provided to have a depth ranging from 200 nm to 1 μm and a diameter ranging from 300 nm to 4 μm.

The seed layer 151 may be used as a seed in a crystal growth process of the metal oxide structure 154. The seed layer 151 may be provided on a bottom surface of each of the holes 150H. A material of the seed layer 151 may include zinc oxide (ZnO). The seed layer 151 may be deposited using a sputtering process. The seed layer 151 may have a thickness ranging from 30 nm to 200 nm. The seed layer 151 may be formed of the same material as that for the metal oxide structure and may be transparent.

A sidewall 152 may be provided on an inner side surface of each of the holes 150H. The sidewall 152 may be formed of a metal material or a metal alloy material whose electric conductivity is high. The sidewall 152 may be formed of or include at least one of aluminum, copper, silver, or titanium.

Thus, the sidewall 152 may be used to change a shape of an electric field and to supply an electric current in a spatially uniform manner. In particular, the sidewall 152 may be used to increase a current density in lower portions of the holes. Furthermore, the sidewall 152 and the metal oxide structure may be configured to realize a current spreading effect. In the case where light enters into the lower portions of the holes, the light may be reflected by a metallic inner or outer surface of the sidewall 152 and may be emitted to the outside. Accordingly, it may be possible to increase light extraction efficiency.

The metal oxide structure 154 may be crystal-grown from the seed layer 151 to fill the holes 150H. A material of the metal oxide structure 154 may be one of zinc oxide (ZnO), zirconium oxide (ZrO$_2$), titanium oxide (TiO$_2$), chromium oxide (Cr$_2$O), indium zinc oxide (IZO), indium tin zinc oxide (IZTO), indium oxide (In$_2$O$_3$), or tin oxide (SnO$_2$). A refractive index N$_{NR}$ of a material for the metal oxide structure 154 may satisfy the condition of $1 < N_{NR} < N_N$. Here, N$_N$ denotes a refractive index of the n-type GaN layer 150.

In certain embodiments, a material of the metal oxide structure may be changed to a transparent dielectric material. The transparent dielectric material may serve as a wave guide for the metal reflection at the sidewall.

The metal oxide structure 154 may have a total length of L and may include a protruding portion having a height of H. The metal oxide structure 154 may include a filling portion 154a and a protruding portion 154b. The filling portion 154a may be provided to fill the holes 150H of the metal oxide structure 154. The side surface of the filling portion 154a may be in contact with the sidewall 152, and the bottom surface of the filling portion 154a may be in contact with the seed layer 151. The protruding portion 154b may be an end portion of the metal oxide structure 154 that is exposed to the air. The side and top surfaces of the protruding portion 154b may be exposed by the air, and the bottom surface of the protruding portion 154b may be in contact with the top surface of the filling portion 154a. A shape of the protruding portion 154b may be one of hexagonal cone, hexagonal pillar, hemisphere, cone, truncated cone, or cylinder.

In some embodiments, a plurality of the metal oxide structures 154 may be two-dimensionally arranged. For example, the metal oxide structures 154 may be arranged in a matrix or honeycomb structure. The metal oxide structures 154 may be arranged to have a pitch that is greater than or equal to 1.5 times the diameter of the metal oxide structure 154.

In the case where light is incident from a dense medium to a sparse medium with an incident angle larger than a critical angle, the light may be totally reflected by an interface between two media. This phenomenon is called 'total reflection'. The critical angle refers to the minimum incident angle at which the total reflection occurs.

The n-type GaN layer 150 may have a refractive index n1 of about 2.4 and a critical angle θ$_{c1}$ of about 24°. When light generated in the active layer 140 is incident into an interface between the n-type GaN layer 150 and the air, if an incident angle of the light is less than the critical angle θ$_{c1}$, the light may propagate toward the outside along a bent path 1-1', and if the incident angle is greater than the critical angle $\theta_{c1}$, the light may be totally reflected toward the n-type GaN layer 150 (i.e., along a path 2-2').

In the case where the metal oxide structure 154 is formed of zinc oxide (ZnO) whose refractive index n3 is about 2.0, a critical angle $\theta_{c2}$ at an interface between the n-type GaN layer 150 and the seed layer 151 is about 30°. When light generated in the active layer 140 is incident into an interface between the n-type GaN layer 150 and the seed layer 151, if an incident angle is less than critical angle $\theta_{c2}$, the light may be bent to propagate into the filling portion 154a through the seed layer 151. The light incident into the filling portion 154a may be reflected by the metallic surface of the sidewall 152 and may be emitted to the outside through the protruding portion 154b (i.e., along a path 3-3'). If the refractive index of the metal oxide structure is adequately selected, it may be possible to increase an amount of light to be emitted to the outside.

The height H of the protruding portion 154b of the metal oxide structure 154 may be greater than one quarter of a wavelength. Accordingly, the protruding portion may behave like an optical waveguide. A fraction of the light passing through the protruding portion may propagate through an interface between a side surface of the protruding portion and the air, and the remaining fraction may propagate into the air through a top surface of the protruding portion. The hole may be provided to have a cylindrical structure or a tapered cylindrical structure. The structure or shape of the hole may be changed to control a viewing angle.

The n electrode pattern 160 may be provided on a top surface of the n-type GaN layer 150 and may have a mesh structure. The n electrode pattern 160 and the n-type GaN layer 150 may form an ohmic contact. The n electrode pattern 160 may be a Ti- or Cr-based multi-layered structure (e.g., Ti/Al, Ti/Al/Ni/Au, Cr/Al, or Cr/Al/Ni/Au).

FIGS. 2A to 2J are diagrams illustrating a method of fabricating a vertical light-emitting diode device, according to other embodiments of the inventive concept.

A method of fabricating a vertical light-emitting diode device 100 may include sequentially growing a buffer layer 170, an n-type GaN layer 150, an active layer 140, and a p-type GaN layer 120 on a single-crystalline growth substrate 180; sequentially forming a metal reflection layer 112 and a conductive substrate 110 on the p-type GaN layer 120; performing a laser lift-off process to separate the single-crystalline growth substrate 180 from the buffer layer 170 and to remove the buffer layer 170; patterning the n-type GaN layer 150 to form holes 150H; forming a sidewall 152 on an inner side surface of each of the holes 150H; forming a seed layer 151 on a bottom surface of each of the holes 150H; crystal-growing a metal oxide structure 154 on the seed layer 151; and forming an n electrode pattern 160 on the n-type GaN layer 150.

Figure 2A:
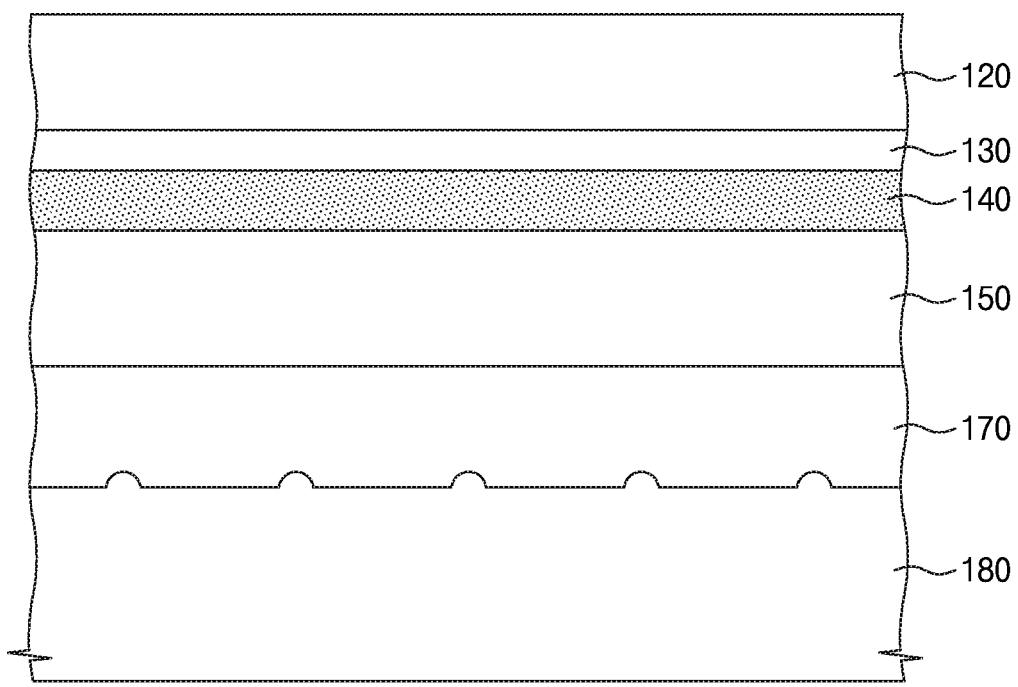
FIGS. 2A to 2J are diagrams illustrating a method of fabricating a vertical light-emitting diode device, according to other embodiments of the inventive concept.

Referring to FIG. 2A, the n-type GaN layer 150, the active layer 140, the electron blocking layer 130, and the p-type GaN layer 120 may be sequentially grown on the single-crystalline growth substrate 180.

Before the growing of the n-type GaN layer 150, the buffer layer 170 on the single-crystalline growth substrate 180 may be un-doped gallium nitride. The buffer layer 170 may be used to reduce a difference in lattice constant between the single-crystalline growth substrate 180 and the n-type GaN layer 150. The buffer layer 170 may be used to reduce a stress between the single-crystalline growth substrate 180 and the n-type GaN layer 150.

The buffer layer 170, the n-type GaN layer 150, the active layer 140, the electron blocking layer 130, and the p-type GaN layer 120 may be grown using a deposition process, such as metal-organic chemical vapor deposition (MOCVD), molecular beam epitaxy (MBE), or hydride vapor phase epitaxy (HVPE).

Figure 2B:
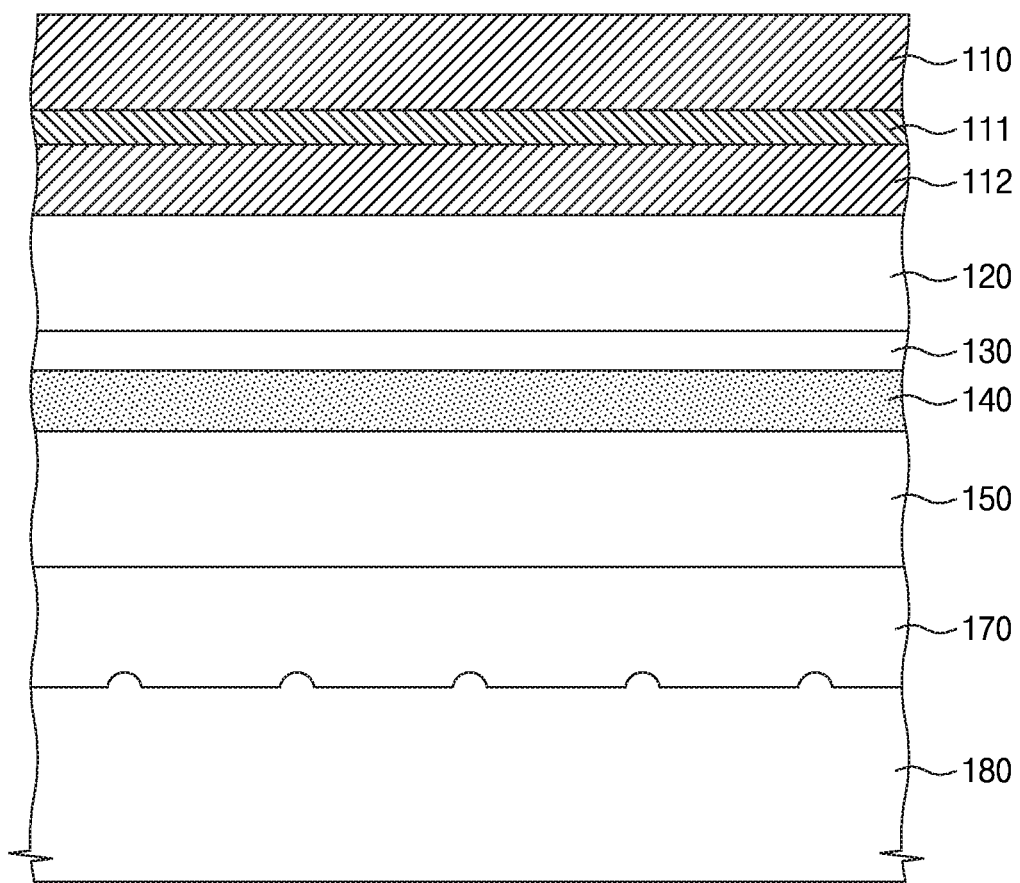

Referring to FIG. 2B, the metal reflection layer 112 may be deposited on the p-type GaN layer 120 and may be used to bond the conductive substrate 110. The metal reflection layer 112 and the conductive substrate 110 may be bonded to each other by a wafer bonding layer 111.

Figure 2C:
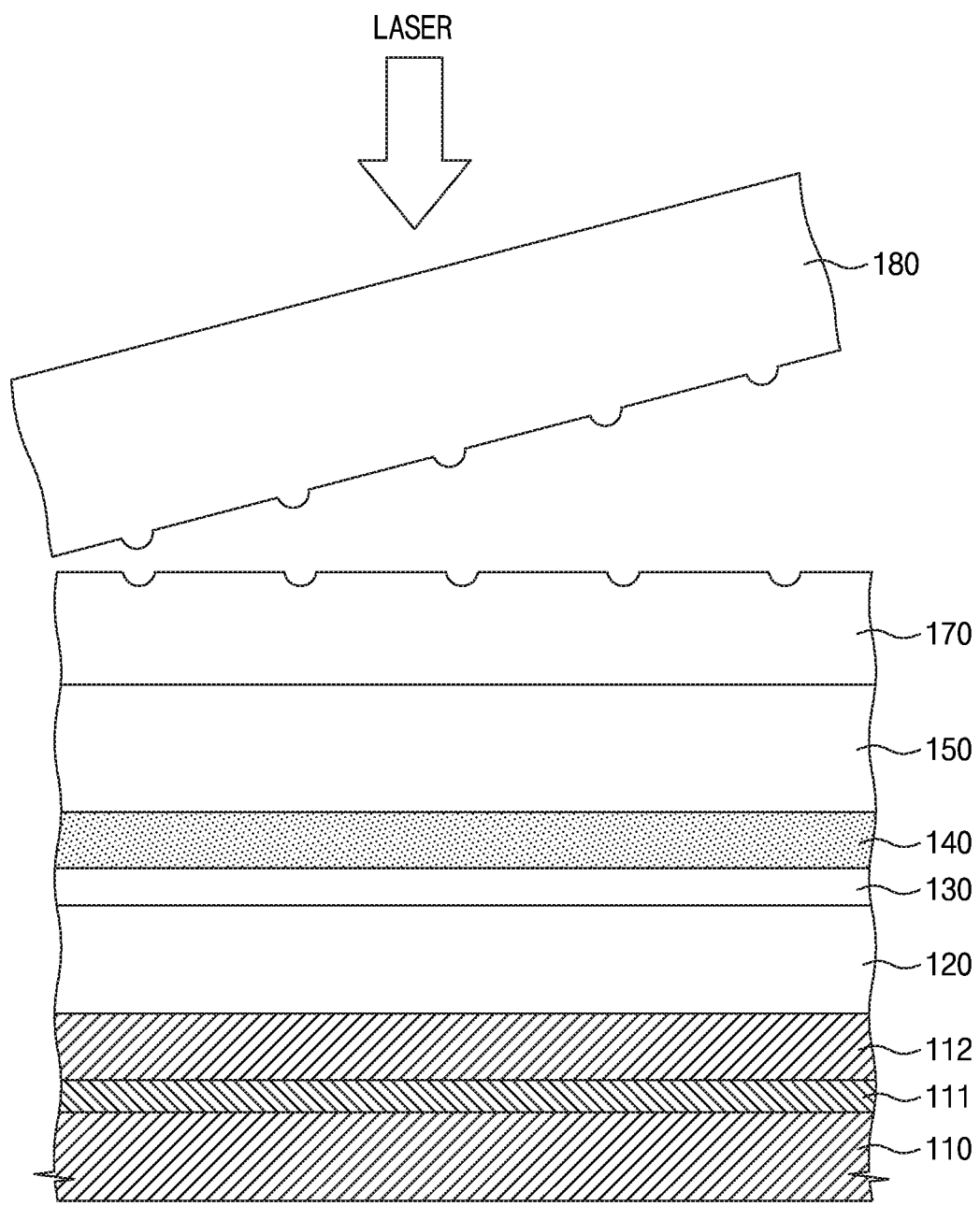

Referring to FIG. 2C, a laser lift-off (LLO) process may be performed to separate the single-crystalline growth substrate 180 from the buffer layer 170.

Figure 2D:
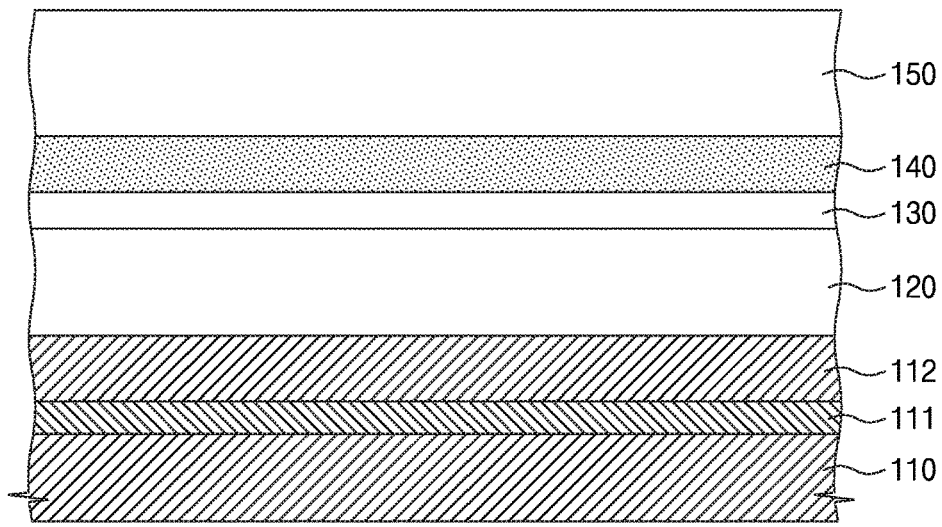

Referring to FIG. 2D, a plasma dry etching process may be performed to remove the buffer layer 170 and to expose a top surface of the n-type GaN layer 150.

Figure 2E:
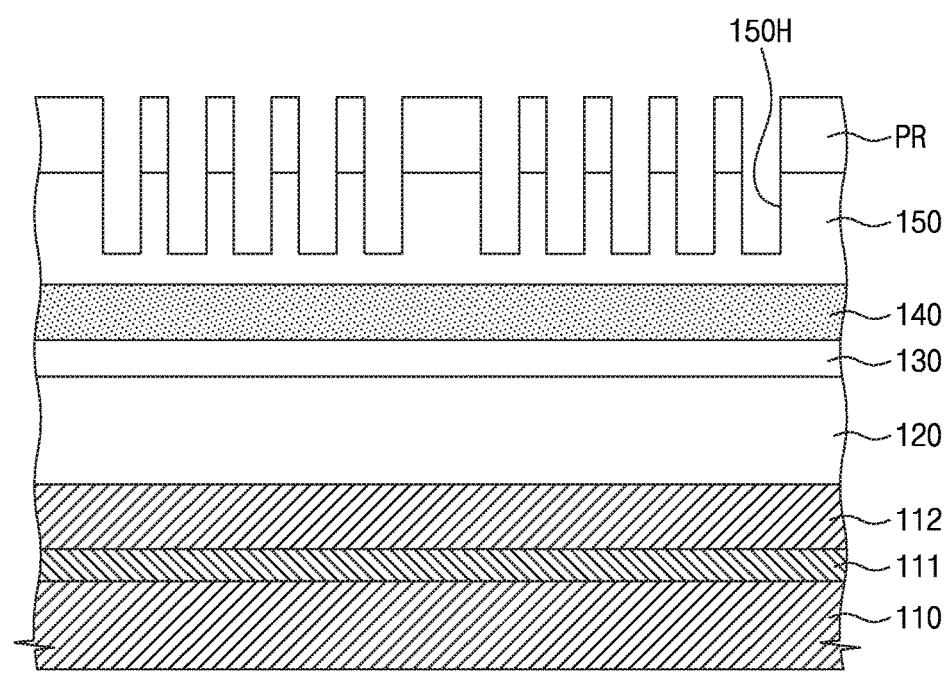

Referring to FIG. 2E, a photoresist pattern PR may be formed on the n-type GaN layer 150, and then, a patterning process using the photoresist pattern PR as an etch mask may be performed on the n-type GaN layer 150 to form a plurality of holes 150H on the n-type GaN layer 150.

Figure 2F:
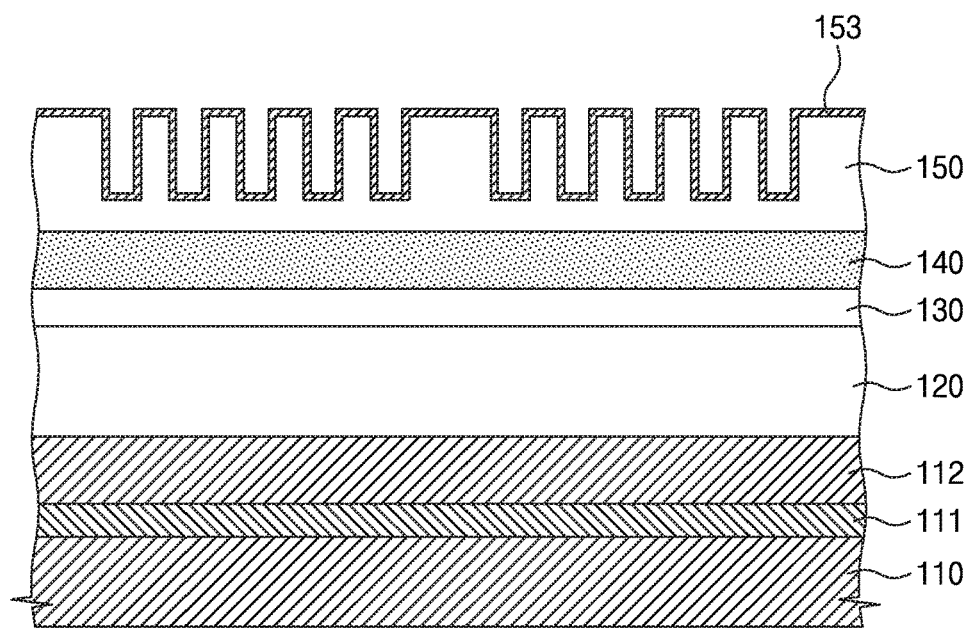

Referring to FIG. 2F, the photoresist pattern PR may be removed, and then, a chemical vapor deposition (CVD) process may be performed to deposit a metal layer, a metal alloy layer, or a dielectric layer on an inner side surface of each of the holes 150H. For example, a preliminary sidewall layer 153 may be deposited conformally.

Figure 2G:
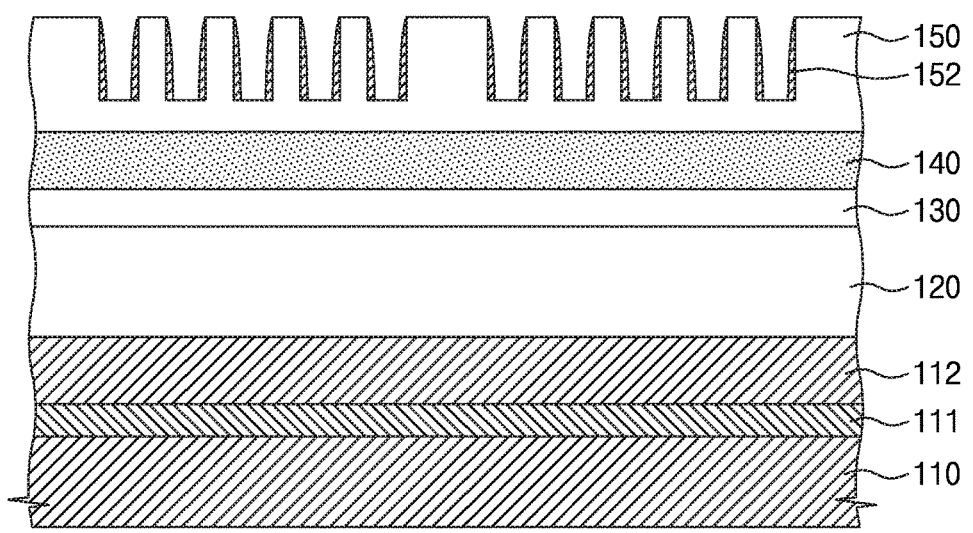

Referring to FIG. 2G, the preliminary sidewall layer 153 may be anisotropically etched to form a sidewall 152 on an inner side surface of each of the holes 150H.

Figure 2H:
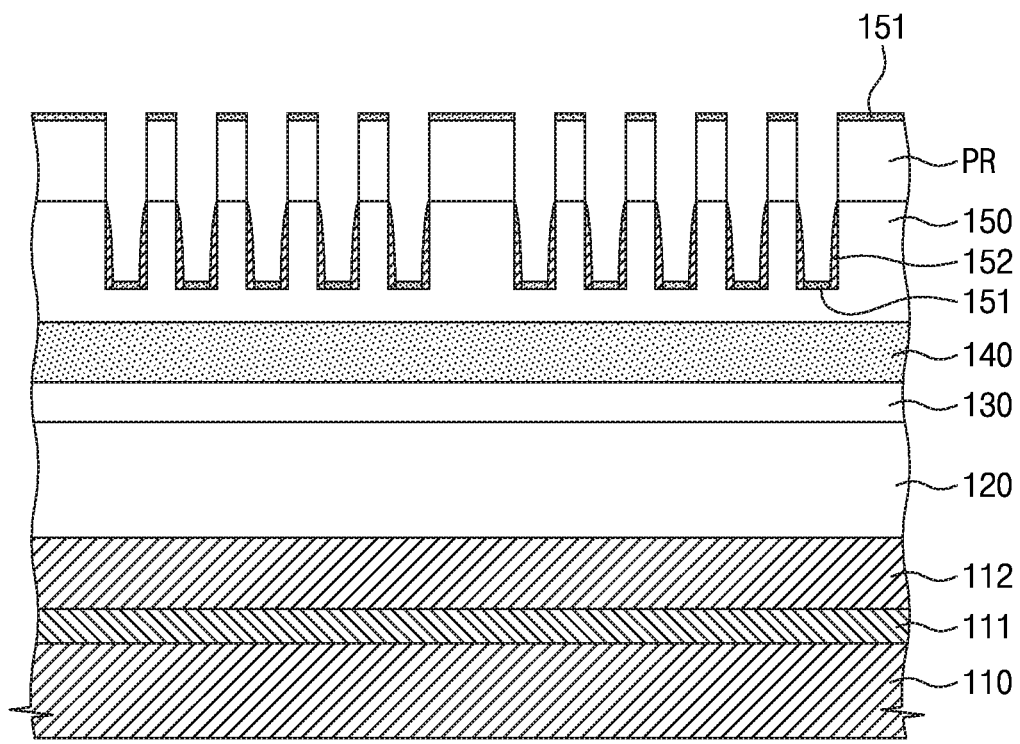

Referring to FIG. 2H, a photoresist pattern PR may be formed on the n-type GaN layer 150 to expose the holes 150H, and then, a seed layer 151 may be deposited on bottom surfaces of the holes 150H.

Figure 2I:
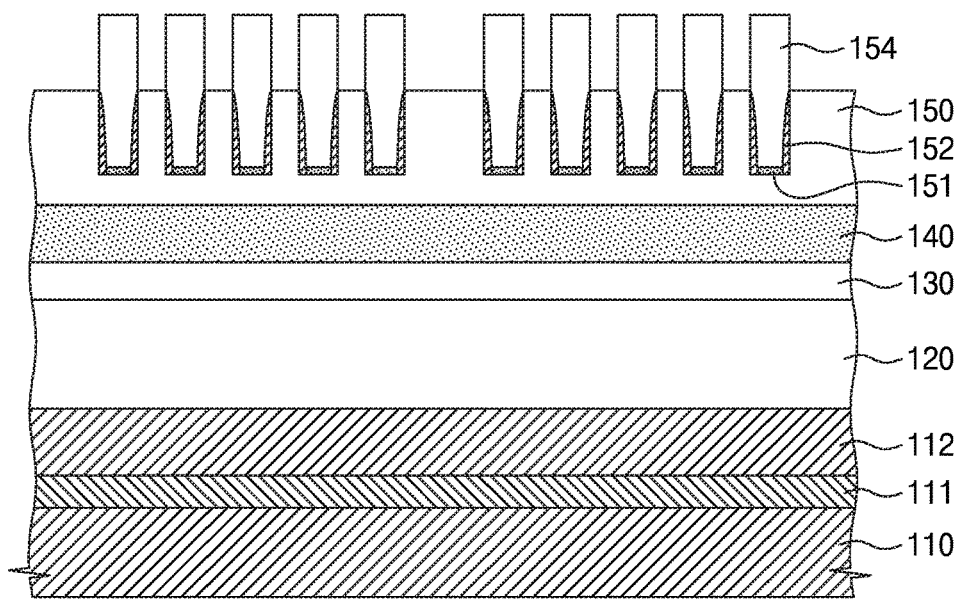

Referring to FIG. 2I, the photoresist pattern PR may be removed, and then, the metal oxide structure 154 may be grown from the seed layer 151 through a crystal growth process. A crystal structure of the metal oxide structure 154 may be dependent on a crystal structure of the seed layer. The metal oxide structure 154 may be grown by a metal organic chemical vapor deposition (MOCVD) process, a sputtering process, a spin coating process, a hydrothermal deposition process, or an electrochemical deposition process. For example, a hydrothermal deposition process given by the following chemical reaction formula may be used to grow the metal oxide structure 154.

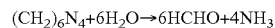

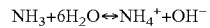

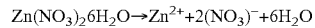

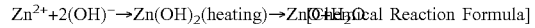

[Chemical Reaction Formula]

(1) Deionized water, zinc nitrate hexahydrate ($Zn(NO_3)_2 \cdot 6H_2O$), and hexamethylenetriamine (HMT, $(CH_2)_6N_4$) may be provided in a specific mole ratio and may be stirred to prepare aqueous solution.

A mole ratio of the zinc nitrate hexahydrate and the hexamethylenetetramine may range from 2:1 to 1:2. The hexamethylenetetramine may serve as a catalyst for fast growth of the metal oxide structure 154 and may be used to persistently supply $OH^-$ ions and so forth. Urea or ammonia may be used instead of the hexamethylenetetramine. Furthermore, in the aqueous solution, a molar concentration of each of the zinc nitrate hexahydrate and the hexamethylenetetramine may range from 0.0001M to 1M. In the case where the molar concentration is less than 0.0001M, it may be difficult to control content of the zinc nitrate hexahydrate and to form the metal oxide structure 154 effectively. By contrast, in the case where the molar concentration is greater than 1M, it may be difficult to control a shape or size of the metal oxide structure 154.

(2) The seed layer 151 may be dipped into the aqueous solution, and then, may be heated at a temperature ranging from 80° C. to 100° C. for 3 hours to 12 hours to grow a layer of zinc oxide (ZnO). If aqueous solution containing $Zn^{2+}$ and $O^-$ ions is supplied to the hole 150H provided with the seed layer 151, $Zn^{2+}$ and $O^-$ ions may be adsorbed onto the seed layer 151. That is, a nucleation and growth process may be performed.

a shape, a diameter, and a length of the metal oxide structure 154 may be controlled by changing at least one of process conditions (e.g., a process temperature, a process time, and an amount, mole ratio, or pH value of the aqueous solution) for the hydrothermal deposition process. That is, the metal oxide structure 154 may be formed in a structure (e.g., diameter, shape, and height) suitable for the purpose.

Figure 2J:
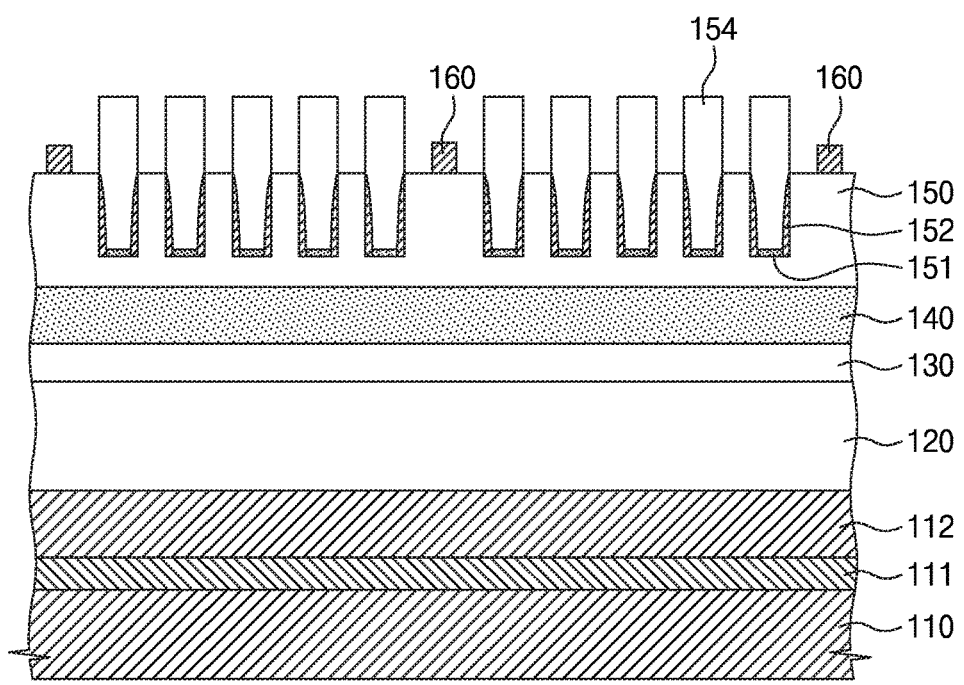

Referring to FIG. 2J, the n electrode pattern 160 may be provided to have a mesh structure on the n-type GaN layer 150. The n electrode pattern 160 may be formed by a lift-off process. The n electrode pattern 160 may be Cr/Al structure, Cr/Au structure, Cr/Al/Pt/Au structure, Ti/Au structure, Ti/Al structure, or Ti/Al/Ni/Au structure.

Figure 3:
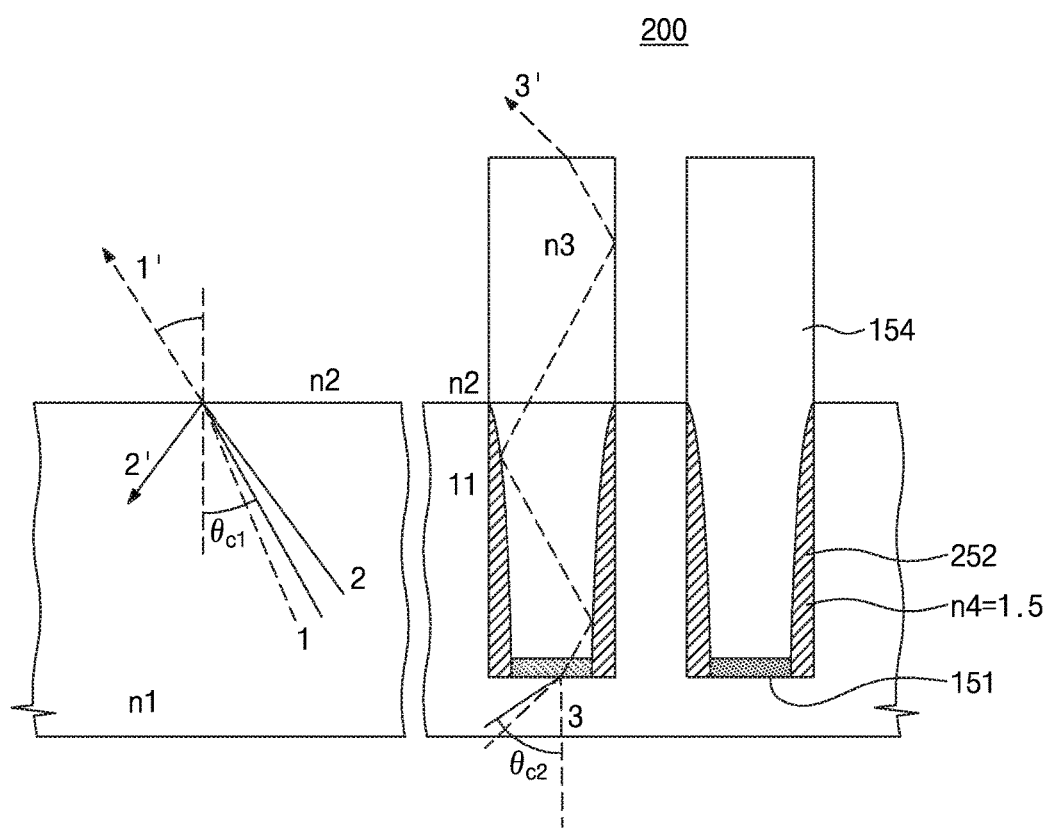
FIG. 3 is a diagram illustrating a change in light propagation path caused by a sidewall, according to other embodiments of the inventive concept.

FIG. 3 is a diagram illustrating a metal oxide structure of a vertical light-emitting diode, according to other embodiments of the inventive concept.

Referring to FIG. 3, a vertical light-emitting diode device 200 may include a conductive substrate 110 serving as a p electrode, a p-type GaN layer 120 on the conductive substrate 110, an active layer 140 on the p-type GaN layer 120, an n-type GaN layer 150 on the active layer 140, an n electrode pattern 160 on the n-type GaN layer 150, a metal oxide structure 154 filling a plurality of holes 150H formed in the n-type GaN layer 150, and a seed layer 151 which is provided on bottom surfaces of the holes 150H and is used as a seed layer in a crystal growth process of the metal oxide structure 154.

A sidewall 252 may be formed of or include a transparent dielectric material whose refractive index is less than that of the metal oxide structure 154. In the case where the sidewall 252 is a silicon oxide layer, the sidewall 252 may have a refractive index of about 1.5, which is less than that of the metal oxide structure 154. Thus, the sidewall 252 may serve as a cladding layer of an optical fiber or an optical waveguide. Light incident through a bottom surface of the metal oxide structure may be guided by the sidewall or through total reflection. Light incident into the filling portion 154a may be totally reflected by the sidewall 252 and may be emitted to the outside through the protruding portion 154b (i.e., along a path 3-3').

Figure 4:
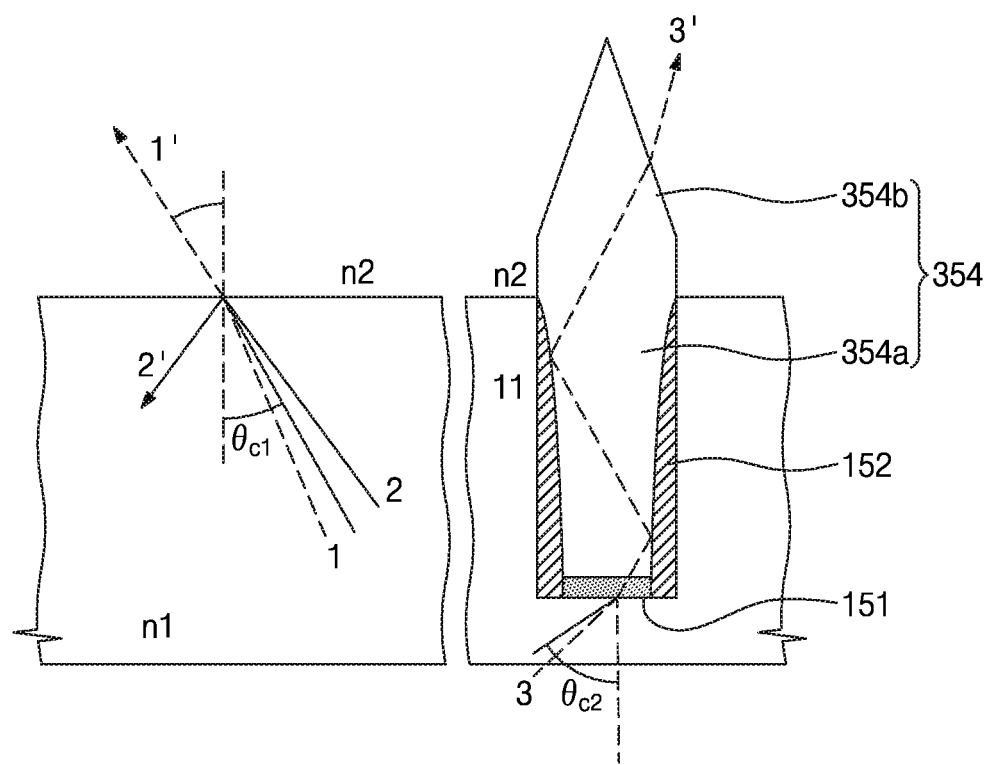
FIGS. 4 and 5 are diagrams illustrating metal oxide structures, according to other embodiments of the inventive concept.

FIG. 4 is a diagram illustrating a metal oxide structure, according to other embodiments of the inventive concept.

Referring to FIG. 4, a vertical light-emitting diode device 300 may include a conductive substrate 110 serving as a p electrode, a p-type GaN layer 120 on the conductive substrate 110, an active layer 140 on the p-type GaN layer 120, an n-type GaN layer 150 on the active layer 140, an n electrode pattern 160 on the n-type GaN layer 150, a metal oxide structure 154 filling a plurality of holes 150H formed in the n-type GaN layer 150, and a seed layer 151 which is provided on bottom surfaces of the holes 150H and is used as a seed layer in a crystal growth process of the metal oxide structure 154.

A shape of a protruding portion 354b may be a hexagonal cone. When light generated in the active layer 140 is incident into an interface between the n-type GaN layer 150 and the seed layer 151, if an incident angle is less than or equal to a critical angle $\theta_{c2}$, the light may be bent to propagate into a filling portion 354a through the seed layer 151. The light incident into the filling portion 354a may be reflected by the metallic surface of the sidewall 152 or totally reflected by a dielectric material and may be emitted to the outside through the protruding portion 354b (i.e., along a path 3-3'). The incident angle may be controlled by a shape of the protruding portion, and this make it possible to control a viewing angle of the LED device and to increase light extraction efficiency of the LED device.

Figure 5:
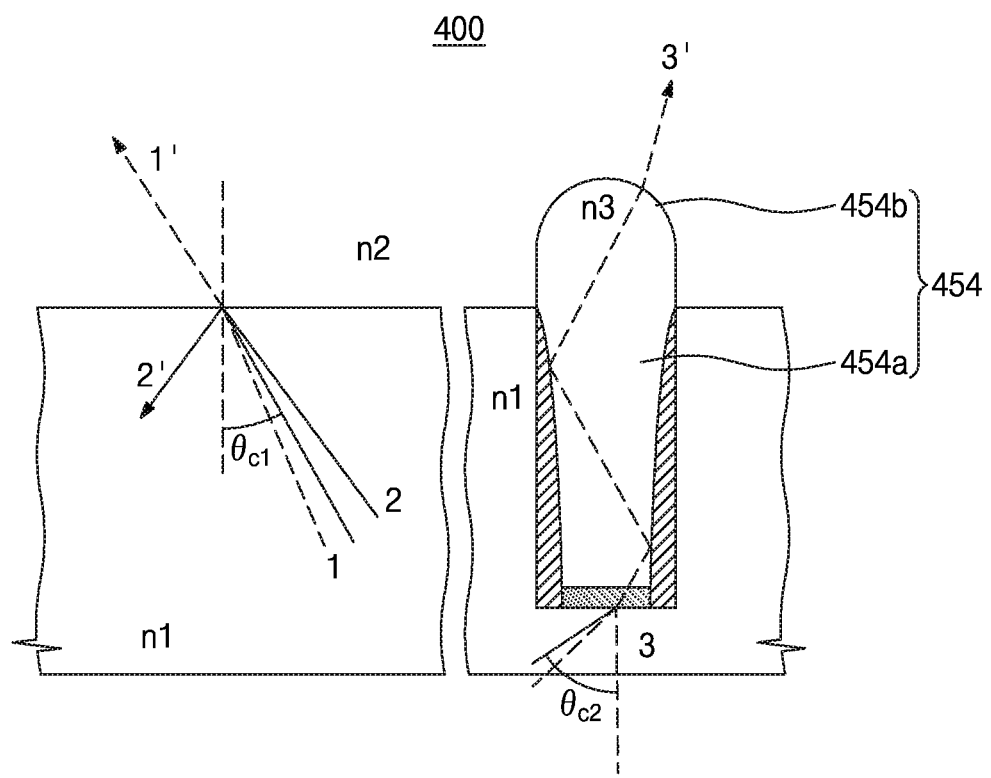

FIG. 5 is a diagram illustrating a metal oxide structure, according to other embodiments of the inventive concept.

Referring to FIG. 5, for a vertical light-emitting diode device 400, a protruding portion 454b may have a hemispherical shape. When light generated in the active layer 140 is incident into an interface between the n-type GaN layer 150 and the seed layer 151, if an incident angle is less than or equal to a critical angle $\theta_{c2}$, the light may be bent to propagate into a filling portion 454a through the seed layer 151. The light incident into the filling portion 454a may be reflected by the metallic surface of the sidewall 152 and may be emitted to the outside through the protruding portion 454b (i.e., along a path 3-3'). The incident angle may be controlled by a shape of the protruding portion, and this make it possible to control a viewing angle of the LED device and to increase light extraction efficiency of the LED device.

Figure 6:
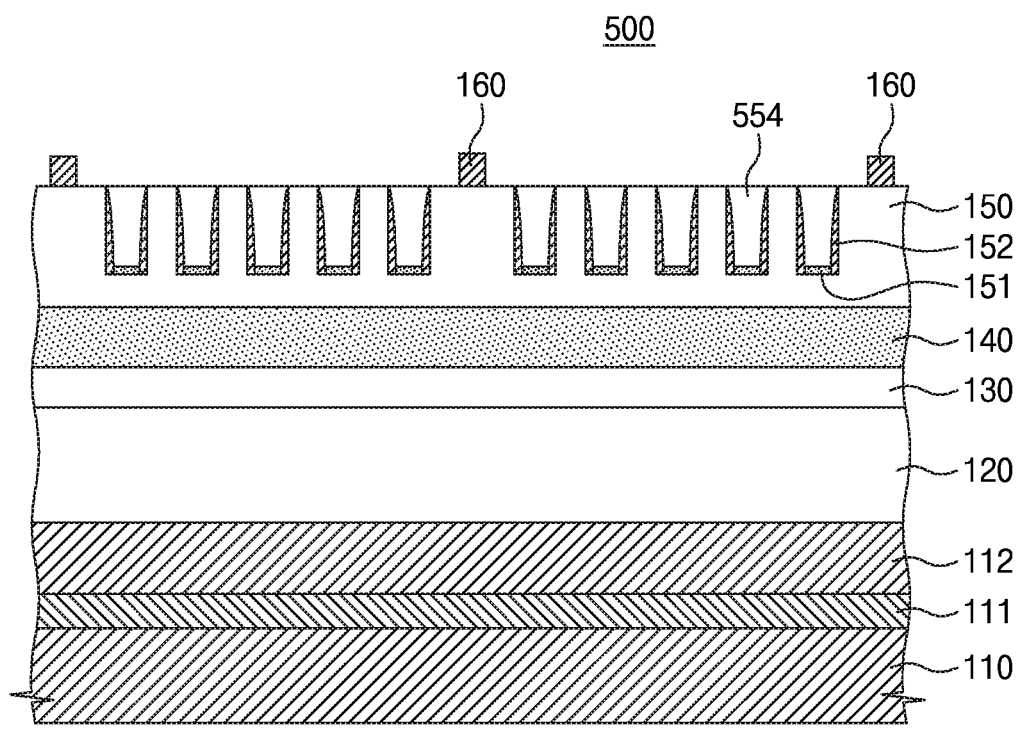
FIG. 6 is a diagram illustrating a metal oxide structure, according to other embodiments of the inventive concept.

FIG. 6 is a diagram illustrating a metal oxide structure 554, according to other embodiments of the inventive concept.

Referring to FIG. 6, the metal oxide structure 554 may not have a protruding portion. When viewed in a sectional view, the metal oxide structure 554 may have a height that is the same as a depth of the hole 150H. In the case where the metal oxide structure has a protruding portion, the protruding portion may be damaged in a subsequent process. By contrast, in the case where there is no protruding portion in the metal oxide structure, it may be possible to easily predict a viewing angle.

According to some embodiments of the inventive concept, a metal oxide structure serving as an optical waveguide may be provided, and in this case, a totally-reflected light may be emitted to the outside through the metal oxide structure. That is, it may be possible to improve light extraction efficiency.

According to some embodiments of the inventive concept, a metal oxide structure may be buried in a nitride semiconductor layer, and in this case, a sidewall, which is formed of a metallic material or a dielectric material having a low refractive index, is provided to surround the metal oxide structure. The sidewall may be used as a metal reflection layer or a cladding layer of an optical fiber wave guide. Accordingly, light extraction efficiency of a light-emitting diode device can be improved.

According to some embodiments of the inventive concept, when the sidewall is formed of a highly conductive metal, a metal alloy, or a dielectric material, it may be used to uniformly supply an electric current to an n-type GaN layer. This may make it possible to increase an area of the active layer for electron-hole recombination. Accordingly, it may be possible to improve a current spreading property of a light-emitting diode device.

According to some embodiments of the inventive concept, by controlling a structure, shape, or length of an exposed portion of the metal oxide structure, it may be possible to adjust a viewing angle. Depending on a growth condition of the metal oxide structure, an end portion of the metal oxide structure may have various shapes (e.g., hexagonal cone, cone, truncated cone, hexagonal pillar, or cylinder). This may make it possible to adjust a viewing angle.

While example embodiments of the inventive concepts have been particularly shown and described, it will be understood by one of ordinary skill in the art that variations in form and detail may be made therein without departing from the spirit and scope of the attached claims.

What is claimed is:

1. A vertical light-emitting diode device, comprising:
a conductive substrate serving as a p electrode;
a p-type GaN layer on the conductive substrate;
an active layer on the p-type GaN layer;
an n-type GaN layer on the active layer;
an n electrode pattern on the n-type GaN layer;
a metal oxide structure filling a plurality of holes in the n-type GaN layer;
a seed layer on bottom surfaces of the holes, and
a sidewall on an inner side surface of each of the holes, wherein:
the conductive substrate, the p-type GaN layer, the active layer, the n-type GaN layer, and the n electrode pattern are in sequential order,
a refractive index of the metal oxide structure is less than that of the n-type GaN layer, and
the holes have a depth D and a diameter W such that D>W/4.

2. The device of claim 1, wherein the sidewall comprises a metal or a metal alloy.

3. The device of claim 1, wherein the sidewall comprises a dielectric material, and
a refractive index of the sidewall is less than that of the metal oxide structure.

4. The device of claim 1, wherein the metal oxide structure comprises a material selected from the group consisting of zinc oxide (ZnO), zirconium oxide ($ZrO_2$), titanium oxide ($TiO_2$), chromium oxide ($Cr_2O$), indium zinc oxide (IZO), indium tin zinc oxide (IZTO), indium oxide ($In_2O_3$), or tin oxide ($SnO_2$).

5. The device of claim 1, wherein the active layer emits light having a wavelength λ, and the diameter W of the hole is such that W/λ>2.405.

6. The device of claim 1, wherein the depth D of the hole ranges from 200 nm to 3 μm.

7. The device of claim 1, wherein the diameter W of the hole ranges from 300 nm to 4 μm.

8. The device of claim 1, wherein the seed layer functions as a seed for crystal growth of the metal oxide structure.

9. The device of claim 1, wherein the seed layer comprises zinc oxide (ZnO).

10. The device of claim 1, wherein the active layer comprises gallium nitride (GaN).

11. The device of claim 10, wherein the active layer generates light, the light propagates toward the n- or p-type semiconductor layer, most of the light is reflected by an interface between the n- or p-type semiconductor layer and air outside the n- or p-type semiconductor layer, and the light reflected by the interface between the n- or p-type semiconductor layer and the air is emitted through the metal oxide structure.

12. The device of claim 1, further comprising a wafer bonding layer on the conductive substrate.

13. The device of claim 12, wherein the wafer bonding layer includes at least one Sn-containing alloy.

14. The device of claim 13, wherein the at least one Sn-containing alloy comprises an Au/Sn alloy or a Ni/Sn alloy.

15. The device of claim 12, further comprising a metal reflection layer, the wafer bonding layer bonds the conductive substrate to the metal reflection layer, and p-type GaN layer is on the metal reflection layer.

16. The device of claim 15, wherein the metal reflection layer reflects light from the active layer toward the n-type GaN layer.

17. The device of claim 15, wherein the metal reflection layer comprises Ag, Al, or a combination thereof.

18. The device of claim 1, wherein the n electrode pattern has a mesh structure.

19. The device of claim 1, wherein the n electrode pattern forms an ohmic contact with the n-type GaN layer.

20. The device of claim 1, wherein the n electrode pattern comprises a multi-layered structure including a Ti or Cr layer and optionally an Al, Ni and/or Au layer.

* * * * *